United States Patent [19]

Thompson

[11] Patent Number: 4,737,436
[45] Date of Patent: Apr. 12, 1988

[54] WATER BASED METHOD FOR MAKING COLOR PROOF IMAGES ON SINGLE SUBSTRATE WITH BLEND OF PIGMENT FOR EACH COLOR IN PHOTORESIST

[75] Inventor: Colin G. Thompson, Essex, England

[73] Assignee: Grafmark International Limited, Duffield, Great Britain

[21] Appl. No.: 799,391

[22] Filed: Nov. 18, 1985

[30] Foreign Application Priority Data

Nov. 23, 1984 [GB] United Kingdom ................. 8429687

[51] Int. Cl.$^4$ .......................... G03C 5/00; G03C 7/20; G03F 3/00; G03F 3/10
[52] U.S. Cl. ..................................... 430/143; 430/145; 430/158; 430/175; 430/177; 430/169; 430/293; 430/294
[58] Field of Search ............... 430/145, 143, 175, 158, 430/293, 177, 169, 294

[56] References Cited

U.S. PATENT DOCUMENTS

| | | | |
|---|---|---|---|
| 3,136,637 | 6/1964 | Larson | 430/143 |
| 3,258,337 | 6/1966 | Cousins | 430/293 |
| 3,486,450 | 12/1969 | Houle et al. | 430/143 |
| 3,765,894 | 10/1973 | Mellan | 430/158 |
| 4,258,125 | 3/1981 | Edhlund | 430/293 |
| 4,391,894 | 7/1983 | Shimazu et al. | 430/175 |
| 4,448,873 | 5/1984 | Walls et al. | 430/175 |
| 4,469,772 | 9/1984 | Barton et al. | 430/143 |

*Primary Examiner*—Charles L. Bowers, Jr.
*Attorney, Agent, or Firm*—Dellett, Smith-Hill and Bedell

[57] ABSTRACT

A method of forming an image on a substrate is described which comprises blending a desired coloring pigment, adding the coloring pigment to a water soluble photoresist, coating the substrate with the pigmented photoresist, exposing the photoresist to actinic radiation to harden the parts of the photoresist occupying the desired image area, and removing with a water based solvent the unexposed photoresist.

8 Claims, No Drawings

WATER BASED METHOD FOR MAKING COLOR PROOF IMAGES ON SINGLE SUBSTRATE WITH BLEND OF PIGMENT FOR EACH COLOR IN PHOTORESIST

FIELD OF THE INVENTION

The present invention relates to photo mechanical imaging, by which is meant the production of an image on a substrate by mechanically placing coatings of ink on the substrate and removing selective regions of the coatings to leave the desired image.

DESCRIPTION OF PRIOR ART

A known method employed in the production of an image on a substrate, for example, for the production of a small number of proofs, is first to seal the surface of the substrate and apply a layer of a water insoluble ink. A water soluble photoresist is next applied over the ink and, after exposure through a mask carrying an image negative, the unexposed portions of the photoresist are washed away with water to leave the hardened photoresist overlying only the image area. Because the ink is insoluble in water, the ink layer is unaffected by the development of the photoresist.

The ink not protected by the hardened photoresist is now removed by the use of a suitable solvent and the hardened photoresist is removed by the use of a second solvent. The reason for the removal of the photoresist layer is that it is not fully transparent and tends to discolour the underlying ink.

It is seen that the above process requires several steps and it has suffered from other serious disadvantages. A first problem is that that some of the solutions used in the process have a relatively short shelf live. More importantly, the process places serious limitations on the resolution that can be obtained in the image. The reason for the poor resolution is that when the ink is removed using the photoresist as a mask, there tends to be some undecutting with the result that any image made up of fine lines or a fine dots is totally washed away during development.

In the manufacture of television picture tubes, it is necessary to place fine dots of a phosphor on a screen and in GB-A-No. 1,447,886 there is described a method of forming such a phosphor screen by coating the screen with a photoresist comprising an aqueous solution a water-soluble diazo compound and a water-soluble polymer in which a phosphor is suspended, exposing the film to light through a shadow mask to harden the exposed portion of the photoresist and develope the coating to remove the unexposed portions.

This process yields images of higher resolution and reduces the number of steps required to produce an image on a substrate. However, in photomechanical imaging one does not merely deposit a predetermined phosphor as the colour of the image to be produced is often critical.

The problem with the above process when applied to photomechanical imaging is that the photoresist is not a clear solution and as a result after development there is a colour change. This may in itself not seem as major problem but it should be noted that it is not possible to keep every colour and shade of colours in stock and in photomechanical imaging it is important to be able to blend different colours to match any desired colour and shade. This cannot be carried by mixing different pigmented photoresists since the end colour will be totally unpredictable.

OBJECT OF THE INVENTION

It is accordingly an object of the invention to provide a method of photomechanical imaging in which a pigment is incorporated in a water-soluble photoresist to allow high image resolution but in which different colours can be blended to achieve predictable results.

SUMMARY OF THE INVENTION

In accordance with the present invention, there is provided a method of forming an image on a substrate which comprises providing a plurality of pigments of different colour, blending selected ones of the pigments in the proportions necessary to produce a colouring pigment of predetermined colour, adding the colouring pigment to a water soluble photoresist, coating the substrate with the pigmented photoresist, imagewise exposing the pigmented photoresist to actinic radiation to harden the parts of the photoresist occupying the desired image area, and removing with a water based solvent the unexposed photoresist.

In all previous applications where an image has been produced by the use of a sensitized pigment, the sensitizing agent or photoresist has been added to the pigment before it reached the end user. The invention however proposes to make the pigments available separately from the sensitizer which tends to discolour the pigment, so that the pigment need only be sensitized after it has been correctly blended to the desired colour and shade.

Because there is no longer a risk of undercut occuring, the process of the invention is capable of yielding images of high resolution. Furthermore, development of the image is simplified as a single development is required to produce the image as compared with the three developments in the prior art method described above using water insoluble inks.

As previously mentioned, the invention avoids the problem of matching a desired shade by enabling the end user to mix and blend unsensitized pigments. After the desired colour of pigment has been achieved, the photoresist is added to sensitize the solution to light. The colour of the solution will of course now change but this is unimportant since the colour of the final image is already determined by the blending and this will not change when the solution is developed and dried.

If the substrate is of a porous material, to prevent staining of the substrate by the pigmented photoresist, it is possible to apply a paper sealer for example, of nitro cellulose.

In proofing of images, it is often desirable to use several colours. This can be achieved in the present invention since the application of a further colour will not interfere with a colour previously laid down. A known method of proofing multicolour images involved the formation of several images on separate but aligned transparent carrier sheets. In other words, a transparent overlay technique was employed but this was not satisfactory because some colours were viewed through several overlays and the image could only be produced on a clear transparent sheet instead of the substrate to be used in the end product.

A further advantage of the invention is that the pigments uses in the preparation of the proof can be matched identically to the pigments used in printing presses. Consequently, it is possible to enable close matching of the colour of the proof to that of the end product of a printing press.

DESCRIPTION OF A PREFERRED EMBODIMENT

The invention will now be described further, by reference to a specific example.

A substrate to which an image is to be applied is placed on a flat board and held in position by means of a suitable clip. If the substrate is porous then a nitro cellulose sealer is applied over the surface of the substrate.

To spread the sealer, a coating rod is used having the form of a cylinder with a very fine helical thread, such as produced by winding a fine wire over a cylindrical core. A measure of sealer is squeezed out across the width of the substrate and the coating rod is drawn over the substrate to apply an even coating. This coating is then dried preferably by blowing hot air from a conventional hairdryer over the surface of the substrate. If the substrate is not of a porous material then the step of applying a sealant coating may not be essential.

The single solution used in forming the image is formed from two main ingredients, namely an ink and a photoresist or sensitizer, the latter being a product of diazodiphenylamine and formaldehyde.

The ink is formed by diluting polyvinyl acetate with demineralised water to obtain a desired viscosity, for example 4 secs in a No. 5 zahn cup. An ink pigment is added to the solution to obtain the required colour blend, a formulation guide being provided to indicate the correct proportions for certain colours. To assist in water development, polyvinyl alcohol may be added prior to the introduction of the pigment.

The sensitizer is added to the ink solution in a volume ratio of 10 parts ink to 1 part sensitizer. Because the solution is formed from concentrates and mixing only takes place at the time of use, the separate ingredients have an extended shelf life.

The next step in the process involves applying the sensitized ink using a coating rod to the entire surface of the sealed substrate and once again drying the layer by blowing hot air over its surface. By providing coating rods having windings of different sizes on their surface, it is possible to alter the density of the colour of the ink layer.

The sensitized and dried ink is now exposed to actinic radiation through a mask carrying a negative image. A box with an ultra-violet light source is used to expose the substrate for typically 45 secs, but this maturally depends upon the power of the light source. The exposure may vary from one colour to another and the length of the exposure, to a certain extent, affects the definition in the final image.

After exposure, the parts of the ink exposed to the light will be water insoluble, whereas the unexposed parts can be removed using a water based solvent. To develope the image, therefore, it only remains to draw over the surface of the substrate a cotton wipe soaked in water. A wetting agent may if required be added to the water. The surface of the substrate is again dried to complete the imaging process.

If a multiple colour image is required, a second sensitized ink is prepared and the process is repeated. Only water based solutions are used in the process and as the first ink image is no longer water soluble, it will be unaffected by the subsequent developments.

After all imaging is complete, the sealer coating may be removed, if desired, by using a solvent which does not affect the dry ink coatings.

The description of a particular embodiment set out above has been given only as a non-limiting example and it should be clear to those skilled in the art that various modifications may be made without departing from the scope of the invention as set forth in the appended claims.

I claim:

1. A method of making color proofs of images to be printed in colored ink on a substrate, the method comprising:
    (a) selecting the printing process and the substrate to be used;
    (b) providing a plurality of pgiments of different colors;
    (c) blending at least some of said pigments to produce a pigment blend, said blend having the same color as an ink to be used in said printing process;
    (d) combining said pigment blend with a water soluble photoresist composition;
    (e) coating said substrate with the photoresist containing said pigment blend;
    (f) imagewise exposing the photoresist coating to actinic radiation to harden parts of the photoresist occupying a desired image area;
    (g) removing unhardened areas of said photoresist coating by dissolving with water, to leave an image in said desired image area and having said same color;
    (h) producing a second image on said substrate after said unhardened areas of said photoresist have been removed, said second image being produced by:
    (i) blending at least some of said pigments to produce a second pigment blend, said second blend having the same color as a second ink to be used in said printing process;
    (j) adding said second pigment blend to a water soluble photoresist composition;
    (k) forming a second coating on said substrate by applying said photoresist containing said second pigment blend;
    (l) imagewise exposing said second coating to actinic radiation to harden parts of the photoresist of said second coating occupying a second desired image area corresponding to said second color; and
    (m) removing unhardened areas of said second coating by dissolving with water, to leave an image of said second color in said second desired image area.

2. The method of claim 1, wherein steps (c) and (i) each comprise comparing the color of the respective pigment blend with a corresponding reference color and adjusting the respective blend in response to the comparison until said respective blend has said corresponding reference color.

3. The method of claim 2, comprising making each comparison between said different pigment blend and a formulation guide.

4. The method of claim 2, comprising making each comparison between said different pigment blend and said ink to be used.

5. The method of claim 1, comprising applying a sealer coat to said substrate prior to step (c) to prevent staining of said substrate.

6. The method of claim 1, wherein each of said photoresist coatings comprises an ink and a photoresist or sensitizer, the latter being a product of diazodiphenylamine and formaldehyde.

7. The method of claim 6, wherein the ink is formed by diluting polyvinyl acetate with demineralized water to obtain a desired viscosity, and adding one of said ink pigment blends to the solution to obtain the required color.

8. A method as claimed in claim 7, wherein a polyvinyl alcohol is added to the solution prior to the introduction of the pigment.

* * * * *